United States Patent [19]

Bird et al.

[11] Patent Number: 5,831,810

[45] Date of Patent: Nov. 3, 1998

[54] ELECTRONIC COMPONENT PACKAGE WITH DECOUPLING CAPACITORS COMPLETELY WITHIN DIE RECEIVING CAVITY OF SUBSTRATE

[75] Inventors: Kenneth A. Bird, New Paltz; Peter J. Brofman, Hopewell Junction; Francis F. Cappo, Jr., Wappingers Falls; Jason L. Frankel, Beacon; Suresh D. Kadakia, Poughkeepsie; Sarah Huffsmith Knickerbocker, Hopewell Junction; Scott A. Sikorski, Mount Kisco, all of N.Y.

[73] Assignee: International Business Machines Corporation, Armonk, N.Y.

[21] Appl. No.: 701,029

[22] Filed: Aug. 21, 1996

[51] Int. Cl.$^6$ ........................................ H01G 4/00

[52] U.S. Cl. .................................. 361/301.1; 361/301.3; 361/763; 361/782; 361/807; 361/306.2

[58] Field of Search ........................... 361/761, 763, 361/764, 766, 783, 782, 807, 809, 811, 820, 821, 306.2, 301.4, 301.1, 321.2, 301.3; 257/924, 686, 685, 723, 724, 532, 301, 700, 702; 174/52.4, 260

[56] References Cited

U.S. PATENT DOCUMENTS

| | | |
|---|---|---|
| 5,081,563 | 1/1992 | Feng et al. . |
| 5,103,283 | 4/1992 | Hite ........................................ 257/724 |
| 5,210,683 | 5/1993 | Ley . |
| 5,272,590 | 12/1993 | Hernandez ............................ 361/306.2 |
| 5,403,784 | 4/1995 | Hashemi et al. ........................ 437/217 |

FOREIGN PATENT DOCUMENTS 61-247058  11/1986  Japan ....................................... 257/924

*Primary Examiner*—Kristine L. Kincaid
*Assistant Examiner*—Anthony Dinkins
*Attorney, Agent, or Firm*—DeLio & Peterson, LLC; Peter W. Peterson; Aziz M. Ahsan

[57] ABSTRACT

An electronic component package comprising a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface, and at least one capacitor positioned completely within the cavity and mounted to the terraced contour of the inner sidewall.

17 Claims, 3 Drawing Sheets

ELECTRONIC COMPONENT PACKAGE WITH DECOUPLING CAPACITORS COMPLETELY WITHIN DIE RECEIVING CAVITY OF SUBSTRATE

BACKGROUND OF THE INVENTION

1. Field of the Invention

The present invention generally relates to the placement of decoupling capacitors on substrates.

2. Problem to be Solved

Electronic component packages typically use substrates to which integrated circuit chips are mounted. Some integrated circuit chips require a relatively large amount of decoupling capacitance. Some integrated circuit chips, such as microprocessors, may require decoupling capacitance of about 100nf (nanofarads). Typically, such chips are mounted to substrates wherein the chip is located within a cavity formed in the substrate. Such substrates are known as "cavity substrates". A conventional technique for providing decoupling capacitance in cavity substrates require the use of capacitor layers embedded in the substrate. Such layers are known in the art as "thin tape" layers. When such layers are in the "green" state, i.e. formed but not fired, the layers typically have thicknesses between about 1.0 and 3.0 mils. Such layers require heavy metallization on each side. Thus, "thin tape" layers are difficult and costly to manufacture due to the extreme thinness of the layers and the large amount of metal needed on each side to serve as electrodes. Another conventional technique is the use of surface mounted capacitors. Surface mounted capacitors are significantly less expensive than "thin tape layers". Typically, however, surface mount capacitors are not consistent with substrate profile constraints. For instance, surface mount capacitors may protrude above the surface in some configurations thereby creating a significant geometrical difference between the substrate and the geometry of the chip. Such a result would require the chip to be fitted with longer pins or a special socket seating plane.

One conventional electronic component package is disclosed in U.S. Pat. No. 5,210,683 (the "'683 patent"). The '683 patent teaches placement of capacitors in individual cavities in a substrate. Each cavity is specifically formed in the substrate to receive only one capacitor. However, it is expensive to manufacture a substrate with a plurality of cavities as taught by the '683 patent. Commonly owned U.S. Pat. No. 5,081,563 teaches placing chips inside substrate cavities. Thin film structures are then placed over the top to effect connection of the chip to other components. However, this technique is also costly to implement due to the requirement of the thin film structures.

There are other important factors to be considered when incorporating decoupling capacitance on cavity substrates. One such factor is the location of the capacitors with respect to the chip. For example, optimum performance is obtained when the capacitors are placed as close as possible to the chip. Another factor is compatibility of the final substrate design with the geometry of the actual chip that is to be mounted to the substrate. Another factor is the available space on the substrate for placement of capacitors. Typically, such available space is limited when large-sized integrated circuit chips are mounted to the substrate.

Bearing in mind the problems and deficiencies of the prior art, it is therefore an object of the present invention to provide a new and improved electronic component package having decoupling capacitance incorporated therein.

It is another object of the present invention to provide a new and improved electronic component package that uses a substrate having decoupling capacitance and which is relatively less complex to manufacture than electronic component packages.

It is a further object of the invention to provide a new and improved electronic component package that utilizes a substrate having decoupling capacitance and which provides a maximum amount of space for receiving integrated circuit chips.

It is yet another object of the present invention to provide a new and improved electronic component package that uses a substrate having decoupling capacitance and which cost less to manufacture than conventional electronic component package.

Still other objects and advantages of the invention will in part be obvious and will in part be apparent from the specification.

SUMMARY OF THE INVENTION

The above and other objects, which will be apparent to one of skill in the art, are achieved in the present invention which is directed to, in a first aspect, an electronic component package comprising a substrate having at least one die-receiving cavity formed therein, the cavity being defined by a die-receiving surface and an inner sidewall having a terraced contour, the substrate having an exterior surface bordering the cavity perimeter, the inner sidewall extending be ween the die-receiving surface and the substrate exterior surface, and at least one capacitor positioned completely within the cavity and mounted to the substrate.

In another aspect, the present invention is related to an electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface;

at least one capacitor positioned completely within the cavity and mounted to one of the terraces of the inner sidewall; and a lid attached to the another of the terraces of the inner sidewall and positioned completely within the cavity, the lid being positioned between the capacitor and the die receiving surface and extending over the die receiving surface.

In a further aspect, the present invention is directed to an electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface;

at least one capacitor positioned completely within the cavity and mounted to the die receiving surface; and a lid attached to the substrate and positioned completely within the cavity, the lid extending over the die receiving surface and capacitor.

In yet another aspect, the present invention is directed to an electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface;

at least one capacitor positioned completely within the cavity and mounted to one of the terraces of the inner sidewall; and a lid positioned completely within the cavity and attached to another of the terraces, the capacitor being between the lid and die-receiving surface, the lid extending over the die receiving surface and capacitor.

In still another aspect, the present invention is directed to an electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface;

at least one capacitor positioned completely within the cavity and mounted to one of the terraces of the inner sidewall; and a lid positioned completely within the cavity and attached to another of the terraces, the capacitor being between the lid and die-receiving surface, the lid extending Over the die receiving surface and capacitor.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS

In describing the preferred embodiment of the present invention, reference will be made herein to FIGS. 1 and 2 of the drawings in which like numerals refer to like features of the invention.

Figure 1:
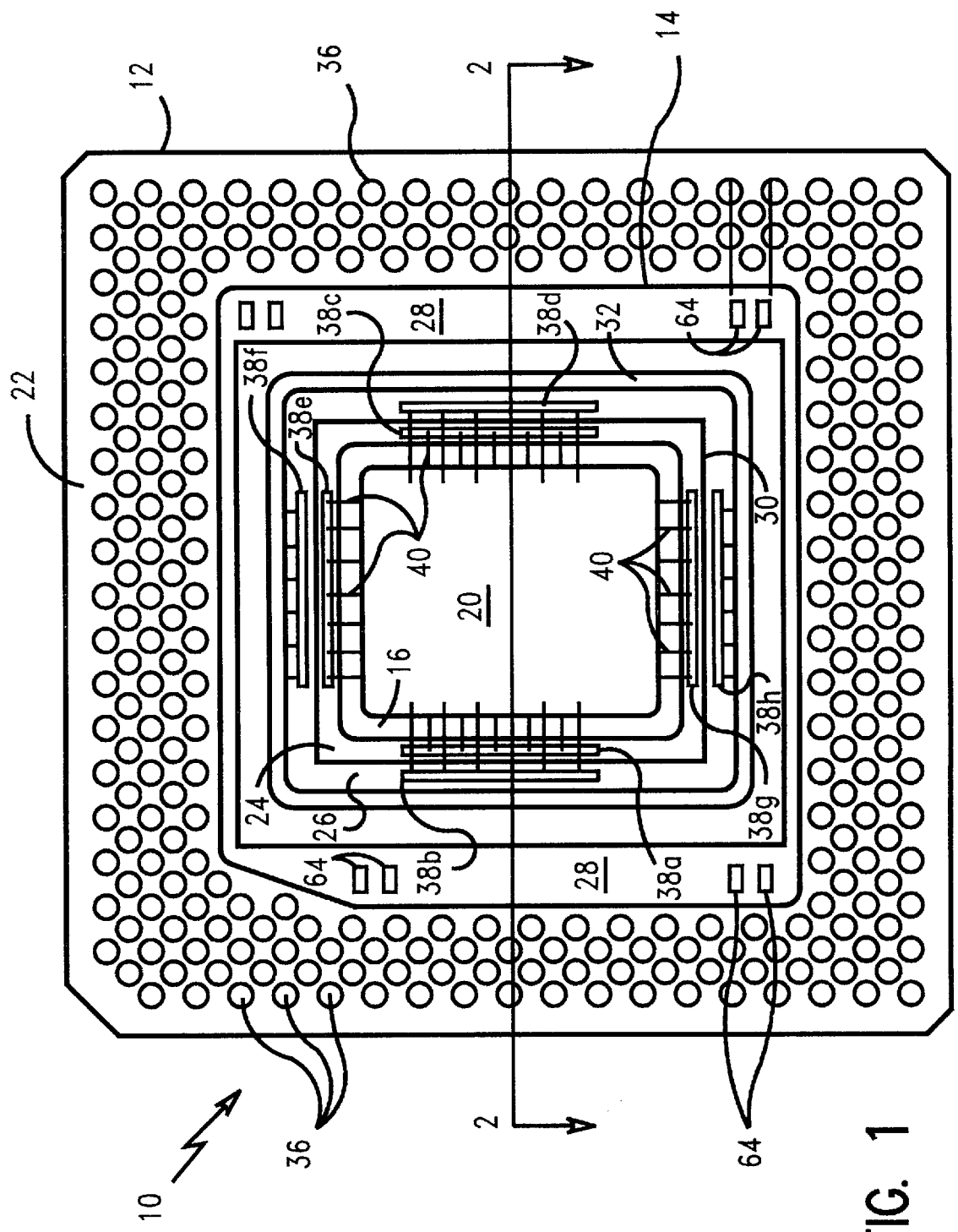
FIG. 1 is a top plan view of a substrate of the present invention.
Figure 2:
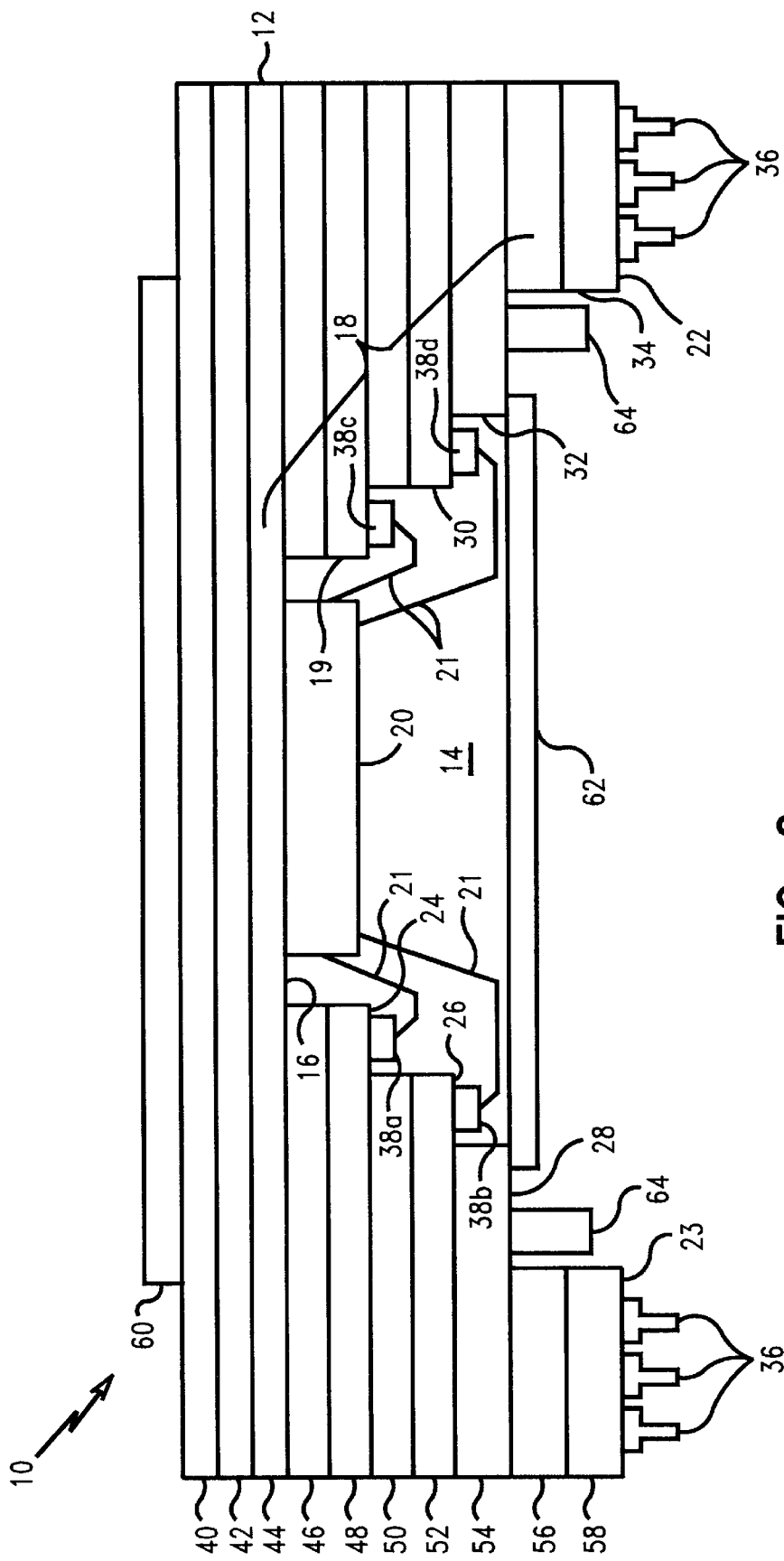
FIG. 2 is a view taken along line 2—2 of FIG. 1.

Referring to FIGS. 1 and 2, electronic component package 10 of the present invention comprises multi-layered substrate 12 which has cavity 14 formed therein. Cavity 14 is defined by die-receiving surface 16 and inner sidewall 18. Surface 16 receives die 20 and is immediately bordered by substantially vertical wall 19. As used herein, the term "die" refers to an integrated circuit chip as cut or diced from a finished wafer. Substrate 12 further includes exterior surface 22 that surrounds or borders perimeter 23 of cavity 14.

Inner sidewall 13 has a terraced or "staircase" contour and defines a plurality of shelves, steps or terraces 24, 26 and 28 that extend between die receiving surface 16 and substrate exterior surface 22. Each terrace 24, 26 and 28 is substantially flat and is contiguous to vertical wall section 30, 32 and 34, respectively. Each terrace comprises a portion of one of the layers of substrate 12. This will be discussed in detail below.

Metal wiring pins 36 vertically extend from exterior surface 22 and are inserted into corresponding openings in a circuit board (not shown). Although wiring pins 36 are used, other types of input/output (I/O) attachment could be used such as balls, columns, solders, etc. Wire bonding pads 38a, c, e, g and 38b, d, f, h are attached to terraces 24 and 26, respectively. Wires 21 connect die 20 to wire bonding pads 38a–h. Pads 38a–h can be connected to pins 36, ground planes or voltage planes. Die 20 can also be a flip chip in which the wire bond pads would not be necessary.

Referring to FIG. 2, substrate 12 comprises a plurality of horizontally stacked insulating, signal and reference-voltage layers. However, the layer functions could be other than these. The signal layers include wiring metallization. Adjacent signal layers are separated by one or more insulating layers. Layers 40, 42 and 50 are metallized redistribution layers. Layers 44 and 52 are electrical ground layers. Layers 48 and 54 are supply voltage layers. Layer 56 includes vertical, conductive through-via columns (not shown) that electrically contact predetermined redistribution layers. Each layer may be made of alumina, glass-ceramic or aluminum-nitride. The through-vias in layer 58 also electrically contact pins 36. Metallization layer 60 is disposed over layer 40 and acts as a heat spreader. Although package 10 is shown to have eleven (11) layers (ten substrate layers and layer 60), it is to be understood that package 10 can have as few as two (2) layers and as many as 200 layers.

Referring again to FIG. 2, cavity 14 is defined by portions of the layers forming substrate 12. Die receiving surface 16 comprises a portion of electrical ground layer 44. Cavity 14 is formed in such a manner that terraces or shelves 24, 26 and 28 are formed by portions of layers 48, 52 and 54, respectively. This can be accomplished by cutting layers 46, 48, 50, 52, 54 56 and 58 to predetermined lengths and then attaching them together to form substrate 12 and cavity 14.

Figure 3:
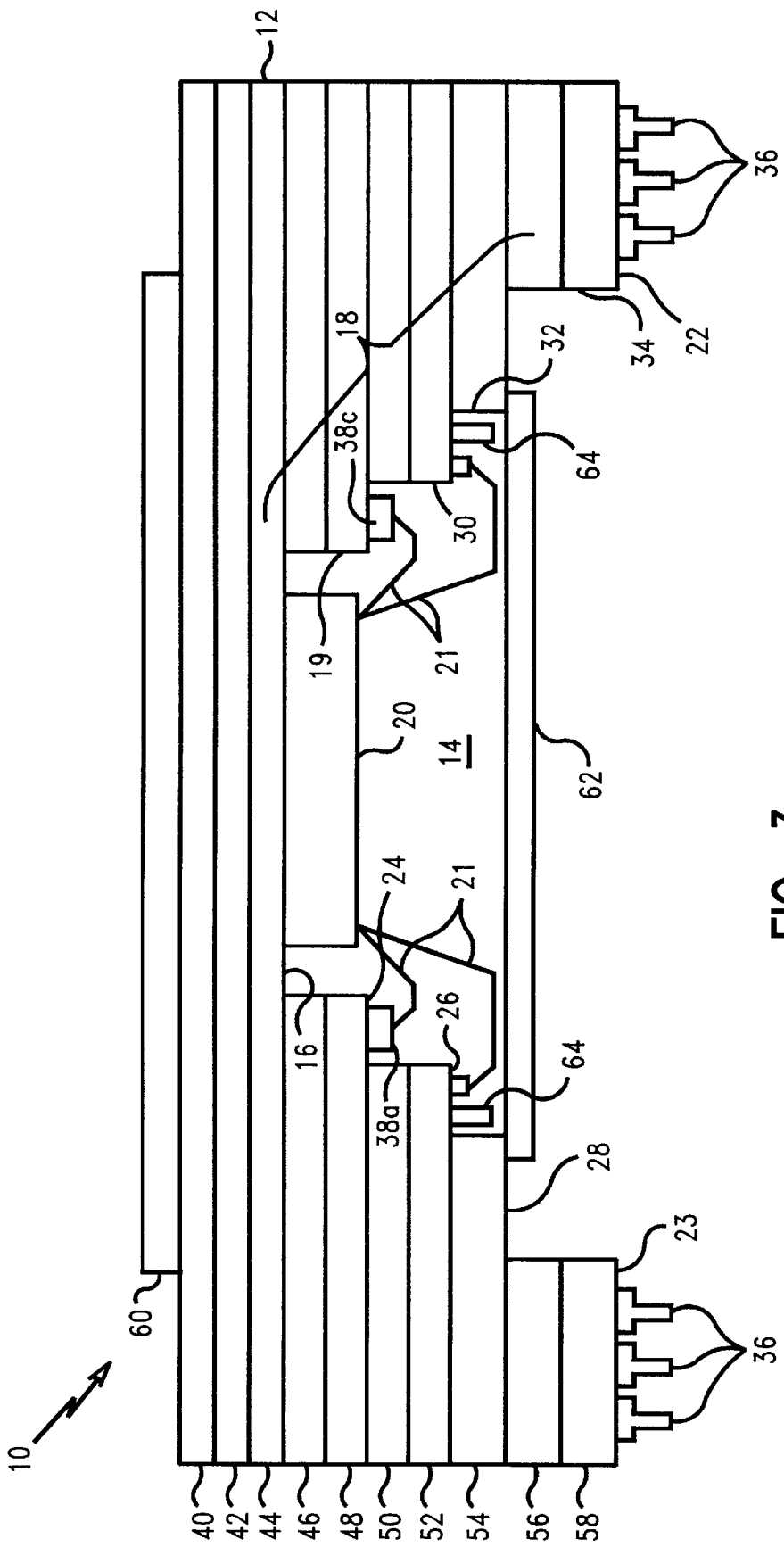
FIG. 3 is a view taken along line 213 2 of FIG. 1 with capacitors shown mounted to the inner sidewall between the die-receiving surface and the substrate surface.

In a preferred embodiment, cap or lid 62 (see FIG. 2) is sealingly attached to terrace or shelf 28 and disposed over die 20 to create a hermetic or non-hermetic seal. As shown in FIG. 2, cap 62 is between separate decoupling capacitor 64 and die 20. Preferably, cap 62 is fabricated from plated Kovar™, or alumina ceramic. Decoupling capacitors 64 could also be placed inside cap 62 and among the wire bond pads. ( see FIG. 3 ) Capacitors 64 can also be mounted to surface 16 adjacent die 20. In accordance with the present invention, discrete decoupling capacitors 64 are attached to terrace or shelf 28 of cavity inner sidewall 18. Such a configuration permits the decoupling capacitors to be placed in close proximity to die 20. Furthermore, such a configuration, as shown in FIG. 2, prevents capacitors 64 from protruding beyond exterior surface 22 of substrate 12. Thus, it is not possible for capacitors 64 to interfere with the placement of package 10 on a circuit board or card. Additionally, connection of capacitors 64 to die 20 are made through the ceramic substrate layers thereby eliminating the need for thin film structures.

Thus, electronic component package 10 of the present invention achieves the aforementioned objects because:

a) package 10 is relatively less complex to manufacture than conventional electronic component packages since only one substrate cavity is required to receive the die and the decoupling capacitors;

b) package 10 may be produced in higher yields than conventional electronic component packages due to the simplicity of the design of package 10;

c) package 10 is relatively less expensive to manufacture for the reasons stated above;

d) package 10 provides a relatively greater amount of available space for receiving integrated circuit chips; and e) package 10 substantially eliminates the possibility of interference with circuit boards or cards because all decoupling capacitor, are below the substrate exterior surface 22.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface; and at least one capacitor positioned completely within the cavity and mounted on said inner sidewall between said die-receiving surface and said substrate exterior surface.

2. The electronic component package as set forth in claim 1 wherein the capacitor is mounted to the terraced contour of the inner sidewall.

3. The electronic component package as set forth in claim 1 further comprising a lid positioned completely within the cavity and attached to the substrate, the lid extending over the die receiving surface and separate from said at least one capacitor.

4. The electronic component package as set forth in claim 3 wherein the capacitor is mounted to the terraced contour and the lid is between the capacitor and the die receiving surface.

5. The electronic component package as set forth in claim 4 wherein the lid is attached to the terraced contour having the at least one capacitor mounted thereto.

6. The electronic component package as set forth in claim 1 wherein the substrate is a multilayer ceramic substrate.

7. The electronic component package as set forth in claim 6 wherein the multilayer ceramic substrate comprises a stacked plurality of parallel signal and insulating layers, each of said signal layers comprising an electrically conductive pattern.

8. The electronic component package as set forth in claim 7 wherein each of said parellel signal and insulating layers is comprised of alumina.

9. The electronic component package as set forth in claim 7 wherein each of said parellel signal and insulating layers is comprised of aluminum-nitride.

10. The electronic component package as set forth in claim 7 wherein each of said parellel signal and insulating layers is comprised of glass-ceramic.

11. The electronic component package as set forth in claim 1 further comprising a plurality of electrically conductive pins attached to the substrate exterior surface.

12. The electronic component package as set forth in claim 1 further comprising a plurality of electrically conductive wire bonding pads mounted to the terraced contour.

13. An electronic component package comprising: a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface; at least one capacitor positioned completely within the cavity and mounted to the terraced contour of the inner sidewall and a lid attached to the terraced contour of the inner sidewall and positioned completely within the cavity, the lid being positioned between the at least one capacitor and the die-receiving surface and extending over the die-receiving surface.

14. An electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface;

at least one capacitor positioned completely within the cavity and directly mounted on said inner sidewall between said die-receiving surface and said substrate exterior surface; and a lid attached to the substrate and positioned completely within the cavity, the lid extending over the die-receiving surface and said at least one capacitor.

15. An electronic component package comprising: a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface; at least one capacitor positioned completely within the cavity and mounted to the terraced contour of the inner sidewall between said die-receiving surface and said substrate exterior surface; and a lid positioned completely within the cavity and attached to the terrace contour, the at least one capacitor being between the lid and die-receiving surface, the lid extending over the die-receiving surface and said at least one capacitor.

16. An electronic component package comprising:

a substrate having at least one die-receiving cavity formed therein, the cavity being defined by a die-receiving surface and an inner sidewall having a terraced contour, the substrate having an exterior surface bordering the cavity perimeter, the inner sidewall extending between the die-receiving surface and the substrate exterior surface;

at least one capacitor positioned completely within the cavity and mounted to the terraced contour; and a lid positioned completely within the cavity between the at least one capacitor and the die-receiving surface and attached to the substrate, the lid extending over the die-receiving surface.

17. The electronic component package as set forth in claim 16 wherein the lid is attached to said terraced contour having said at least one capacitor mounted thereto.

* * * * *

UNITED STATES PATENT AND TRADEMARK OFFICE
CERTIFICATE OF CORRECTION

PATENT NO. : 5,831,810
DATED      : November 3, 1998
INVENTOR(S) : Bird et al.

It is certified that error appears in the above-identified patent and that said Letters Patent is hereby corrected as shown below:

Column 2, Line 13: delete "package" and substitute therefor

--packages--

Column 3, Line 43: delete "213 2" and substitute therefor

--2-2--

Column 3, Line 63: delete "13" and substitute therefor --18--

Column 6, line 43, (claim 15, line 12,) delete "terrace" and substitute --terraced--.

Signed and Sealed this

Twenty-seventh Day of April, 1999

Attest:

Q. TODD DICKINSON

*Attesting Officer*       *Acting Commissioner of Patents and Trademarks*